United States Patent
Zueger

(10) Patent No.: US 10,043,642 B2
(45) Date of Patent: Aug. 7, 2018

(54) MAGNETRON SPUTTERING SOURCE AND ARRANGEMENT WITH ADJUSTABLE SECONDARY MAGNET ARRANGEMENT

(75) Inventor: Othmar Zueger, Triesen (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 1090 days.

(21) Appl. No.: 12/362,901

(22) Filed: Jan. 30, 2009

(65) Prior Publication Data

US 2009/0205949 A1    Aug. 20, 2009

Related U.S. Application Data

(60) Provisional application No. 61/025,437, filed on Feb. 1, 2008.

(51) Int. Cl.
*C23C 14/34* (2006.01)
*H01J 37/34* (2006.01)

(52) U.S. Cl.
CPC ...... *H01J 37/3408* (2013.01); *H01J 37/3402* (2013.01); *H01J 37/3405* (2013.01); *H01J 37/3455* (2013.01)

(58) Field of Classification Search
CPC ....... C23C 14/542; C23C 14/35; H01J 37/345
(Continued)

(56) References Cited

U.S. PATENT DOCUMENTS 4,401,539 A * 8/1983 Abe et al. ................ 204/192.13
4,891,560 A    1/1990 Okumura et al.
(Continued)

FOREIGN PATENT DOCUMENTS

JP    03146660 A  *  6/1991
JP    03-183123 A    8/1991
(Continued)

OTHER PUBLICATIONS

International Search Report for PCT/EP2009/051111, dated May 20, 2009.
Written Opinion for PCT/EP2009/051111, dated May 20, 2009.

*Primary Examiner* — Jason Berman
(74) *Attorney, Agent, or Firm* — Pearne & Gordon LLP

(57) ABSTRACT

The magnetron sputtering source comprises a target mount for mounting a target arrangement comprising a sputtering target having a sputtering surface; a primary magnet arrangement for generating close to said sputtering surface a magnetron magnetic field describing one tunnel-like closed loop having an arc-shaped cross-section; a secondary magnet arrangement for generating close to said sputtering surface an auxiliary magnetic field having a substantially arc-shaped cross-section, said auxiliary magnetic field superposing with said magnetron magnetic field and being substantially inversely polarized with respect to said magnetron magnetic field; and an adjustment unit for adjusting said auxiliary magnetic field. The vacuum treatment apparatus comprises such a magnetron sputtering source. The method for manufacturing coated substrates by magnetron sputtering using a magnetron sputtering source comprises the steps of a) generating close to a sputtering surface of a target said magnetron magnetic field; b) generating close to said sputtering surface said auxiliary magnetic field; and c) adjusting said auxiliary magnetic field. In particular, said secondary magnet arrangement comprises several separately adjustable segments. Using the invention, it is possible to determine gauge functions for precisely achieving target thickness distributions.

26 Claims, 9 Drawing Sheets

(58) Field of Classification Search
USPC ............... 204/298.16, 198.17, 198.19, 298.2
See application file for complete search history.

(56) References Cited

U.S. PATENT DOCUMENTS

| | | | | |
|---|---|---|---|---|
| 5,262,028 | A * | 11/1993 | Manley ............... | H01J 37/3408 |
| | | | | 204/192.12 |
| 5,399,253 | A | 3/1995 | Gruenenfelder | |
| 6,132,576 | A * | 10/2000 | Pearson .................... | 204/298.2 |
| 6,351,075 | B1 * | 2/2002 | Barankova et al. ..... | 315/111.71 |
| 6,432,285 | B1 * | 8/2002 | Kastanis et al. ......... | 204/298.16 |

FOREIGN PATENT DOCUMENTS

| | | |
|---|---|---|
| JP | 03-260067 A | 11/1991 |
| JP | 05-214527 A | 8/1993 |
| WO | 2006-034598 A | 4/2006 |

* cited by examiner

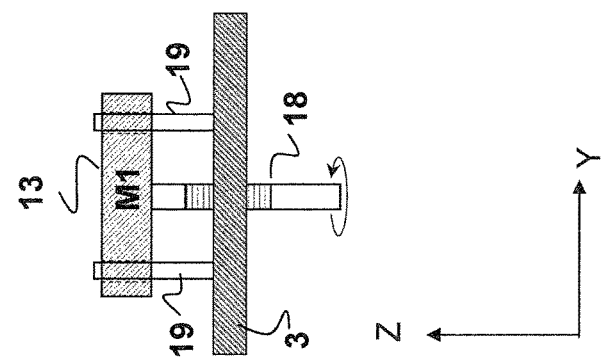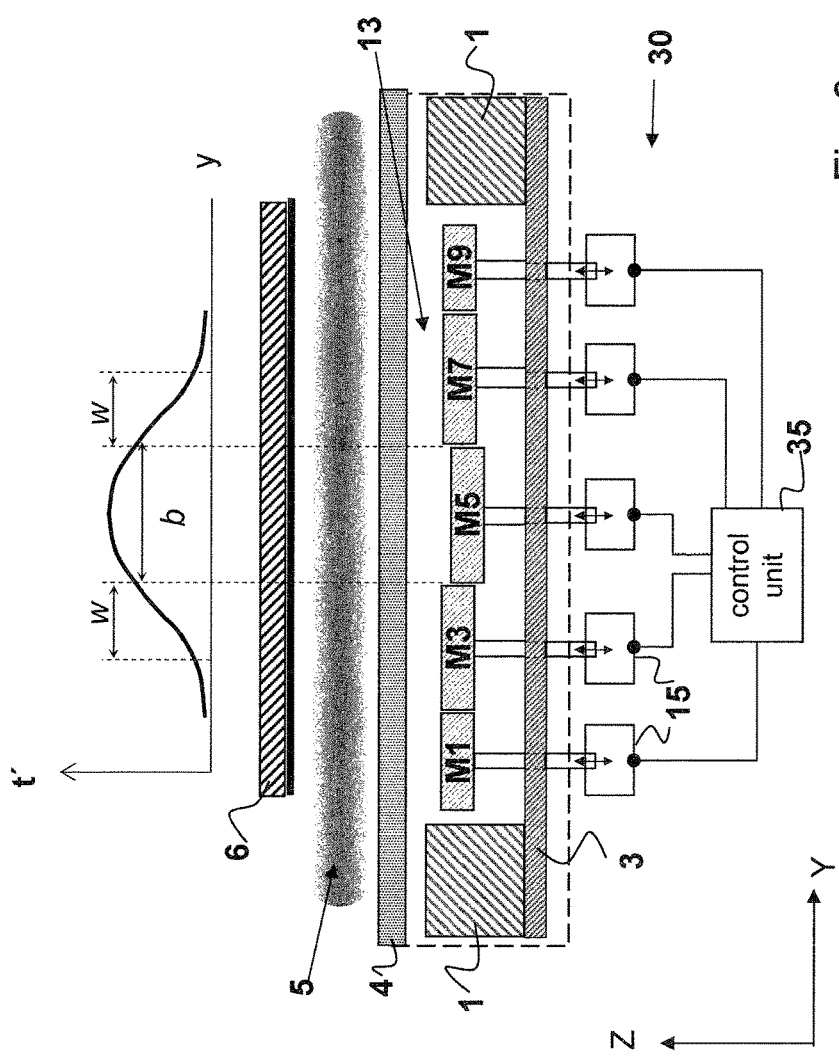

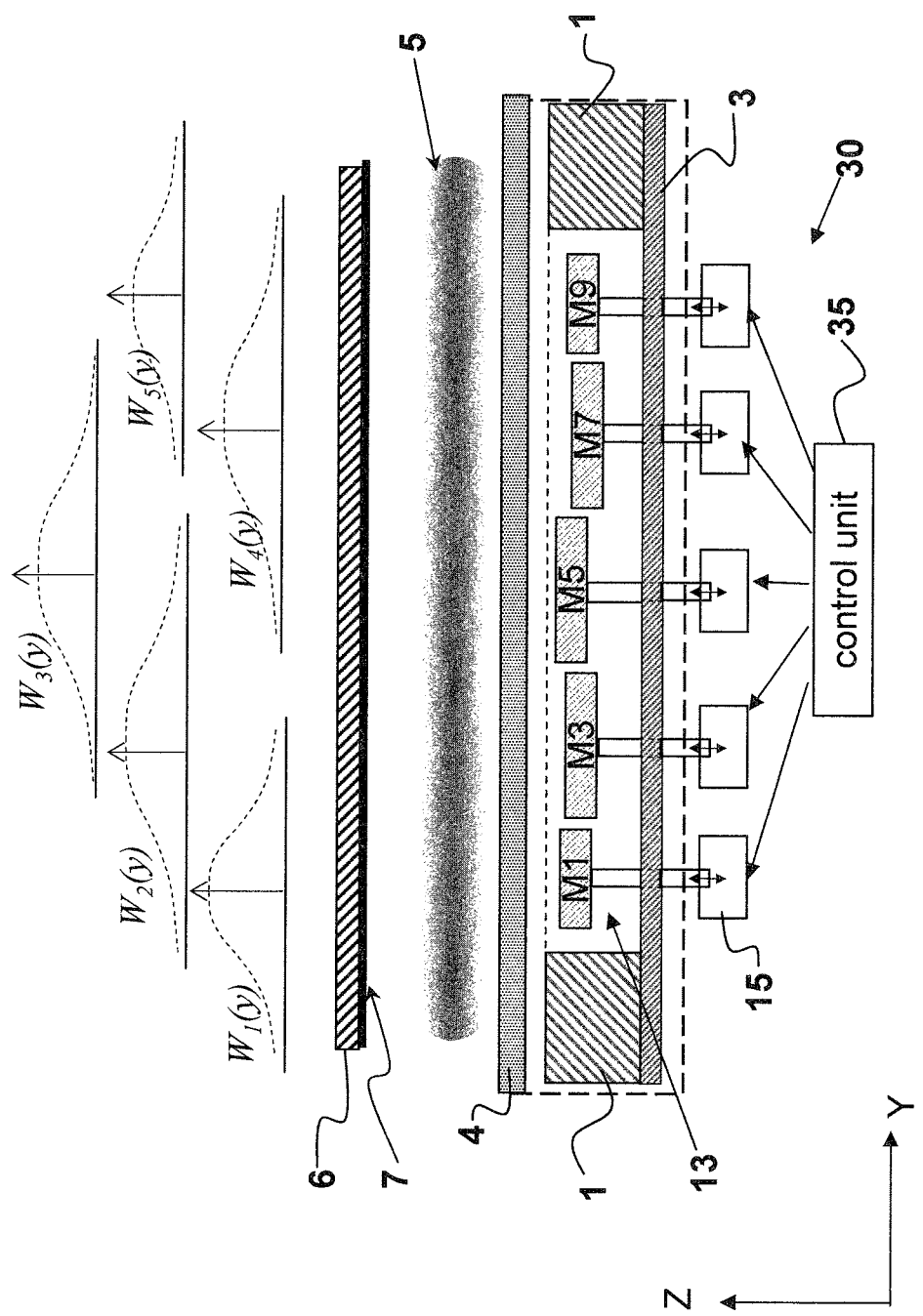

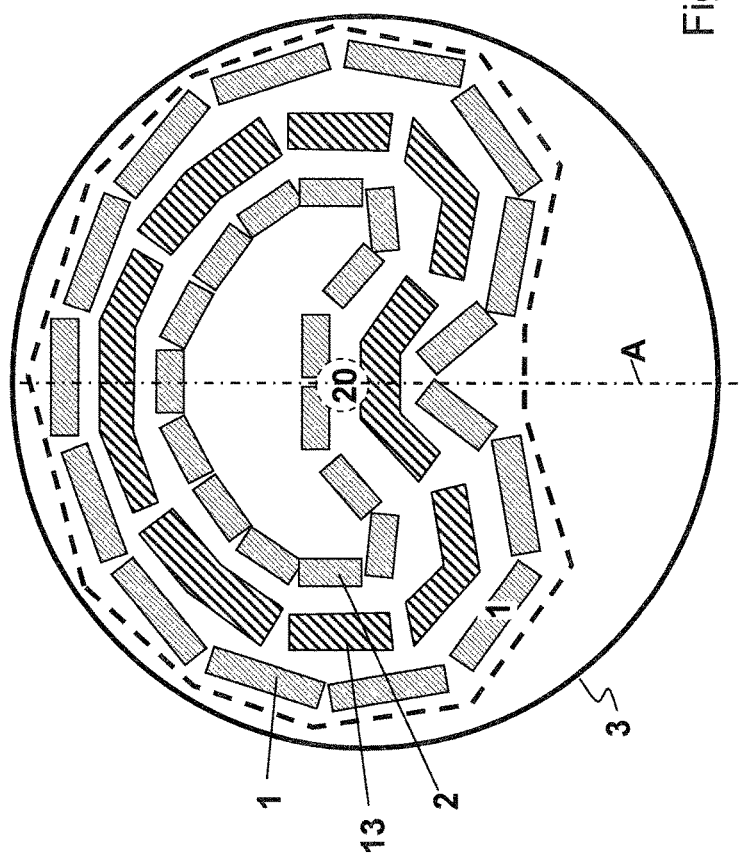
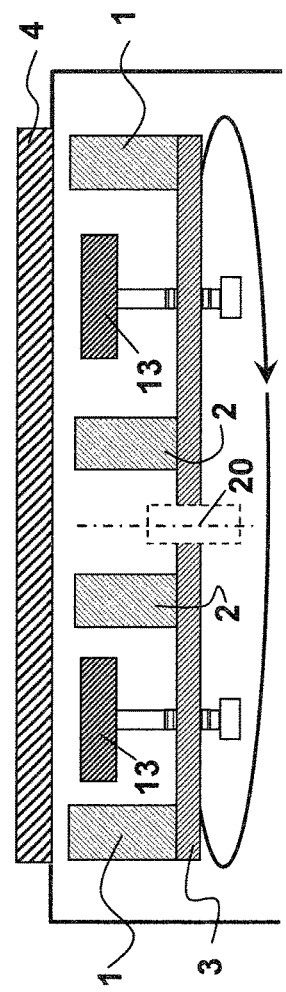

MAGNETRON SPUTTERING SOURCE AND ARRANGEMENT WITH ADJUSTABLE SECONDARY MAGNET ARRANGEMENT

TECHNICAL FIELD

The invention relates to the field of vacuum coating technology, more particularly to magnetron sputter coating technology. It relates to methods and apparatuses according to the opening clauses of the claims.

Sputter coating technology is applied for producing thin films in, e.g., the semiconductor industry, the optical industry (optical coatings), the data storage industry, as well as for producing functional films or coatings for other applications. Since it is mostly asked for high deposition rates, magnetron sputtering sources, more precisely magnetron cathode sputtering sources, are widely used.

BACKGROUND OF THE INVENTION

In sputtering cathodes, the coating material present as a "target" is eroded by energetic ions from a plasma discharge, and the material set free by the ions forms, on a substrate (work piece) a coating (film). The plasma discharge is maintained in an evacuated vacuum chamber (process chamber) under controlled inlet of a working gas (inert gas) with an electric potential and a discharge current applied by a power supply between target cathode and an anode.

In the standard case of electrically conductive target materials, the target is supplied with a continuous or pulsating negative voltage, such that a dense plasma forms above the target surface. By means of the electrical field forming between plasma and target surface as cathode fall, ions from the plasma are accelerated onto the target surface, leading, because of their impact, to the erosion of the target surface and therefore to freeing of target material.

In case of electrically non-conductive target materials, the plasma discharge is maintained using a high-frequency supply leading to an ion bombardment of the target pulsating with the high-frequency, thus resulting in a sputter erosion process of the target.

In case of coatings with a composition of target materials, the material that has been set free deposits on the substrate in at least approximately the same composition as present in the target.

In case of a reactive process (reactive sputtering), additionally or alternatively to an inert gas for maintaining the plasma, one or more (additional) gases (reactive gases) are fed into the vacuum chamber with which the target material chemically reacts, such that a corresponding chemical compound forms on the substrate. Reactive processes are in particular used for oxide coatings in optical or in semiconductor industry, for forming transparent or insulating oxide coatings on the substrates.

A great advantage of sputtering processes originates from the fact that the relative material erosion off the target per process step or per process batch in case of multilayer processes is very low, and accordingly, very many processes can be carried out until the target material is used up and the target has to be replaced.

Thus, it is possible to operate a coating apparatus in the so-called load-lock mode, in which the separate substrates are fed into the process chamber via a load-lock, thereafter being coated therein, and thereafter being taken out of the system again via said load-lock. This way, the process chamber can be kept at vacuum conditions for a long time, which generally leads to a substantially improved process stability and reproducibility of the coating process.

During the lifetime of a target, certain drifts of the process conditions occur, which, e.g., in the load-lock mode, can be controlled or corrected with difficulty only. These originate from the increasing erosion of the target, from films forming on parts of the process chamber and from elsewhere. In particular, the coating thickness distribution over the extension of the substrate is subject to certain drifts during the target lifetime. Too large deviations from a target value can make it necessary to open the coating chamber several times in order to correct the relative coating thicknesses over the coating surface by means of suitable measures such as aperture corrections, geometrical corrections at the anodes or at the gas distributions, or the like. Such interruptions of a regular process cycle are not only time-consuming, but also influence disadvantageously the process stability and reproducibility, and they can require additional test processes after each correction in order to keep up the process stability and reproducibility.

In order to be able to better explain the invention, in the following, a typical setup of a known sputter magnetron (magnetron sputtering source) will be discussed. Therein, it will be referred to FIG. 1, although FIG. 1 shows an arrangement according to the invention.

In a magnetron sputtering source, the plasma density above the target is strongly increased by means of suitable magnetic fields. This is achieved mainly by means of an elongated arrangement of permanent magnets, later on also referred to as primary magnet arrangement, arranged behind the target outside the process chamber.

The arrangement of permanent magnets comprises a first part (referenced 1 in FIG. 1) and a second part (referenced 2 in FIG. 1), as schematically shown in FIG. 1. The first part 1 is formed, e.g., by magnets of one and the same field orientation arranged in a closed loop. The closed loop runs along the outer edge of the backside of the target. The second part 2 is formed, e.g., by a magnets of the opposite field orientation arranged in a row or also in a closed loop. This row or closed loop is arranged in the middle of the backside of the target.

The magnets of the first and second part can be arranged between the backside of the target and a ferromagnetic back plate 3. Through this, a mechanical as well as a magnetic connection between the first part 1 and the second part 2 of the primary magnet arrangement is provided. Magnetic field lines 12 of the magnets of the first part 1 penetrate the target 4, describe an arc shape above the target and penetrate the target 4 near the second part 2, thus forming magnetic field lines of the second part 2. Therefore, the magnetic field lines 12 form a closed-loop tunnel above the target 4, the magnetic field 12 lines running substantially parallel to the target surface 4a in the upper region of the tunnel.

Where the magnetic field lines 12 run at least approximately parallel to the target surface 4a, a particularly high plasma density 5 can form. That high plasma density 5 forms a closed region above the target surface 4a extending along a closed path approximately around the target 4. Ions from this region reach the target material via the cathode potential with particularly high energy, thus leading to the target erosion and the setting free of target material desired in the sputtering process. In case of elongated targets 4, the erosion trench formed this way reminds of a race track (cf. FIG. 2b). This closed curve of strong erosion is therefore often referred to as target erosion race track 11 or simply race track (cf. FIG. 2b). The width of this region of strong erosion is substantially influenced by the geometric shape of the magnetic field lines.

In order to achieve a high utilization of the target, it is desirable to increase the width of the region of high erosion (the width of the race track line). Since, at least usually, the permanent magnets generating the magnetron magnetic field have to be arranged behind the target and outside the process chamber, and since, in addition, a field of 10 Gauss to several 100 Gauss is required for obtaining a high erosion rate and deposition rate, the shape of the field lines 12 can be influenced to a limited amount without resulting in significant other disadvantages such as a decrease in deposition rate.

It is known that it is possible to use a secondary magnetic field (also referred to as auxiliary magnetic field) oppositely polarized with respect to the above-described magnetic field (referred to as primary magnetic field or magnetron magnetic field) for the purpose of increasing the width of the erosion region, thus increasing the utilization of the target material. The two magnetic fields (field lines referenced 12 and 16, respectively, in FIG. 1) superpose, resulting in a magnetic field (field lines referenced 17 in FIG. 1) with flatter magnetic field lines 17 near the highest point. This auxiliary magnetic field is generated by means of an additional magnet arrangement 13, also referred to as secondary magnet arrangement 13, which is arranged between the two parts 1 and 2 of the primary magnet arrangement, the polarity thereof being inverse to the polarity of the magnets of the primary magnet arrangement. This oppositely polarized auxiliary magnetic field (cf. 16 in FIG. 1) can be formed, e.g., by permanent magnets or by ferromagnetic parts (magnetic shunts or simply "shunts") which are oppositely polarized when in the field of the primary magnet arrangement.

For example, in U.S. Pat. No. 5,262,028, permanent magnet arrangements are described which generate such an auxiliary magnetic field, thus achieving an increased target utilization.

In the arrangements described in U.S. Pat. No. 4,865,708 and in U.S. Pat. No. 4,892,633, ferromagnetic shunts as described above are arranged between the inner part and the outer part of a primary magnet arrangement as described above, which lead to the desired increase of the target utilization.

In U.S. Pat. No. 4,810,346, a different kind of magnetron sputtering arrangement is described. In this case, in addition to the primary magnet arrangement, a coil is provided. The coil is formed by winding wire around the inner part (cf. 2 in FIG. 1) of the primary magnet arrangement. By controlling an alternating current flowing through the coil, the resulting magnetic field can be varied. It is to be noted that, due to the described arrangement of the coil relative to the primary magnet arrangement, there is substantially only one magnetic circuit formed (by primary magnet arrangement and coil together). The coil and the primary magnet arrangement are also not separate from each other, since the inner part (cf. reference 2 in FIG. 1) of the primary magnet arrangement is at the same time a part of the magnet arrangement of the coil (since the coil's wire is wound around that part). The shape of the resulting field is substantially the same as the shape of the magnetic field generated by the primary magnet arrangement alone.

Back to separate secondary magnet arrangements, it is to be noted that a secondary magnet arrangement with permanent magnets has, with respect to ferromagnetic shunts, the advantage that their magnetization is not induced by the primary (magnetron) magnetic field, which allows to provide more flexible magnet configurations, so as to allow to change the primary (magnetron) magnetic field in a more specific manner. Due to the higher magnetization, it is also possible to achieve a stronger field using a smaller magnet volume.

By means of a suitable choice of the magnitude and the precise position of such an auxiliary magnet field system (however the field may be realized), it is possible to achieve that the range in which the magnetic field lines 17 (of the field resulting from the superposition) run substantially parallel to the target surface is substantially enlarged. Since the high plasma density and, correspondingly, the high ion density forms over a wider area of the target 4, in the sputtering process a larger width of the line of the erosion race track 11 (cf. FIG. 2b) results. Consequently, more target material can be eroded until the target 4 reaches, at its thinnest place in the race track, a (usually predetermined) minimal thickness, thus having to be replaced.

In today's applications, the target utilization can readily be doubled by means of optimized secondary magnet arrangements, or even, after a suitable optimization of the magnet arrangement, be increased by a factor of 3 to 4. With such an auxiliary magnetic field functioning as an opposing field with respect to the primary (magnetron) magnetic field, the field strength above the target is decreased in the relevant area, which results in a decrease of the plasma density and, accordingly, of the ion density, which determines the rate of the sputtering process. As a consequence thereof, the voltage of the gas discharge increases, and therewith increases the electrical field strength, by means of which the ions are accelerated onto the target surface. Since the erosion efficiency of ions increases with increasing speeds, the lower ion density is to a large extent compensated for by the higher sputtering efficiency, and therefore, no substantial loss of sputtering rate results.

If a loss of sputtering rate nevertheless occurs, this can be fought also by means of other measures like, e.g., by increasing the process gas pressure or by changing the composition of the process gas, by optimizations of the geometrical configuration of the magnetron cathode, of the primary magnets.

Manufacturing applications of sputtering processes in coating apparatuses require a particularly good utilization of the coating material eroded from the target. In case of rectangular magnetron cathodes, the substrates shall be coated over a range along the target, said range being as large as possible. Typically, the substrates are moved during the coating process such that they pass the target at at least approximately constant speed. This is accomplished, e.g., either in conjunction with a linear movement, or, in particular if the substrates are on a drum, in a convex or concave movement. Because of such a movement, a more or less homogeneous coating with respect to the direction of the movement of the substrate is achieved on the substrates.

Usually, a uniformity of the coating thickness on the substrates as good as possible shall be achieved, in particular in the direction of the movement of the substrate and perpendicularly thereto. In special cases, a specific, predetermined thickness profile perpendicularly to the direction of the movement of the substrate may be desired. Further below, the invention will be discussed by means of the often-occurring case according to which a uniformity (of the coating thickness) as good as possible shall be achieved. The generalization for the case of a general specific, predetermined coating thickness profile is immediately clear to the person skilled in the art.

A good uniformity usually necessitates correction measures in order to compensate for coating thickness deviations present in systems. Different approaches are used, frequently apertures are arranged between target and substrate by means of which a too high flux of material to the substrate is blocked. Other measures make use of the process gas distribution, or of the plasma discharge via the anode configuration. These measures have in common that the correction measures utilize parts located within the process chamber, and therefore, they can be carried out when the system, in particular the process chamber, is open, i.e. each correction necessitates a ventilation of the chamber resulting in all disadvantages related thereto.

From the above, it is clear that it is desirable to find an alternative method and apparatus for sputter coating of substrates, in particular one that enables an increased target utilization and/or an increased productivity of the coating process.

SUMMARY OF THE INVENTION

Therefore, one object of the invention is to create alternative apparatuses and methods for sputter-coating substrates. In particular a corresponding magnetron sputtering source, a corresponding vacuum treatment apparatus and a corresponding method for manufacturing coated substrates by magnetron sputtering shall be provided.

Another object of the invention is to provide a way of sputtering enabling a particularly high target utilization.

Another object of the invention is to provide a way of sputtering enabling a particularly high productivity.

Another object of the invention is to provide a way of sputtering enabling to produce coating thickness distributions particularly close to target thickness distributions.

Further objects emerge from the description and embodiments below.

At least one of these objects is at least partially achieved by apparatuses and methods according to the patent claims.

The magnetron sputtering source comprises
- a target mount for mounting a target arrangement comprising a sputtering target having a sputtering surface;
- a primary magnet arrangement for generating close to said sputtering surface a magnetron magnetic field describing one tunnel-like closed loop having an arc-shaped cross-section;
- a secondary magnet arrangement for generating close to said sputtering surface an auxiliary magnetic field having a substantially arc-shaped cross-section, said auxiliary magnetic field superposing with said magnetron magnetic field and being substantially inversely polarized with respect to said magnetron magnetic field; and
- an adjustment unit for adjusting said auxiliary magnetic field.

Through this, it is possible to provide adjustments of said auxiliary magnetic field in a well-defined manner.

To be noted: When we write that a magnetic field has a certain shape, this is only a shorthand for writing that the field lines of that magnetic field describe that certain shape.

The term "polarization" of a magnetic field, as used in this patent application, is described by the sense of direction from north pole to south pole along the magnetic field lines of the magnetic field.

A "target mount" is a device or appliance by means of which a target arrangement can be mounted, usually in a vacuum chamber.

A "target arrangement" can be mounted and dismounted to and from, respectively, a target mount. It comprises as its predominant part a "target", i.e. a usually plate-like member consisting of the material (coating material) which is to be freed into the process area for a coating operation. Nevertheless, a target arrangement may additionally comprise further members such as a backing plate, or clamping members interacting with clamping members of the target mount. A target arrangement is mounted to and dismounted from the target mount as one unitary part.

As stated above, said magnetron magnetic field describes a single tunnel-like closed loop having an arc-shaped cross-section, which is the usual case for magnetron magnetic fields. In a view perpendicularly to the target surface, the magnetron magnetic field describes a looped shape.

Viewed in a suitable cross-section (perpendicular to the target surface and perpendicular to the loop line), the magnetron magnetic field describes an arc shape, like a tunnel.

It is to be noted that said the magnetron sputtering source may comprise, besides said primary magnet arrangement, further magnet arrangements, in particular also further magnet arrangements generating further magnetic fields describing one (or more) tunnel-like closed loops having an arc-shaped cross-section.

The location of said magnetic fields (magnetron magnetic field and auxiliary magnetic field) "close to said sputtering surface" more particularly means that said magnetic fields are considered only in a region extending from said sputtering surface into a direction pointing away from said sputtering target. Magnetic field portions within the target or below the target are not considered to be part of said magnetron magnetic field and auxiliary magnetic field, respectively.

In one embodiment, said adjustment unit is an adjustment unit for adjusting said auxiliary magnetic field relative to said magnetron magnetic field. This turned out to enable particularly useful field adjustments.

In one embodiment, which may be combined with one or more of the before-addressed embodiments, said auxiliary magnetic field is variable, in particular with respect to said magnetron magnetic field.

In one embodiment, which may be combined with one or more of the before-addressed embodiments, said adjustment unit is an adjustment unit for adjusting said auxiliary magnetic field with respect to its shape.

In one embodiment, which may be combined with one or more of the before-addressed embodiments, said adjustment unit is an adjustment unit for adjusting said auxiliary magnetic field with respect to its position.

In one embodiment, which may be combined with one or more of the before-addressed embodiments, said adjustment unit is an adjustment unit for adjusting said auxiliary magnetic field with respect to its magnitude.

In one embodiment, which may be combined with one or more of the before-addressed embodiments, said adjustment unit is an adjustment unit for adjusting a relative position with respect to an axis substantially perpendicular to said target surface, of said primary magnet arrangement and of at least a portion of said secondary magnet arrangement. Worded differently, said adjustment unit is an adjustment unit for adjusting, relative to a position of said primary magnet arrangement along an axis substantially perpendicular to said target surface, a position of at least a portion of said secondary magnet arrangement along an axis substantially perpendicular to said target surface. This embodiment is implementable with relatively moderate effort and nevertheless allows to achieve excellent coating results.

In one embodiment, which may be combined with one or more of the before-addressed embodiments, said secondary magnet arrangement comprises at least one coil, and said adjustment unit is an adjustment unit for adjusting a current flowable through said coil. This embodiment is implementable with relatively moderate effort and nevertheless allows to achieve excellent coating results. In particular, said secondary magnet arrangement comprises at least one coil on a shunt.

Said primary magnet arrangement and said secondary magnet arrangement, respectively, can be composed of one or more of the following types of "magnets": permanent magnet, electromagnet (also simply referred to as coil), ferromagnetic material generating a magnetic field in an external magnetic field (shunt). Usually, for the primary magnet arrangement, permanent magnets will be used, whereas for the secondary magnet arrangement any combination of the named types of magnets are likely to be used.

In one embodiment, which may be combined with one or more of the before-addressed embodiments, said secondary magnet arrangement is segmented comprising at least two segments which can be adjusted separately from each other by means of said adjustment unit. This strongly enhances the flexibility of the secondary magnet arrangement and therewith the possibilities to enhance the magnetic field resulting from the superposition of the magnetron magnetic field with the auxiliary magnetic field.

In one embodiment of this embodiment, said segments comprises or substantially is one such "magnet" or a combination of two or three of such, or in particular a coil on a shunt.

In one embodiment with a segmented secondary magnet arrangement, said primary magnet arrangement has a symmetry axis or symmetry plane, and said secondary magnet arrangement comprises two sets of at least one segment each (in particular at least two segments each), the segments of said two sets being arranged non-symmetrically with respect to each other with respect to said symmetry axis or symmetry plane, in particular shifted with respect to each other with respect to positions arranged symmetrically with respect to said symmetry axis or symmetry plane. This embodiment further enhances the flexibility of the secondary magnet arrangement allowing to achieve even better agreement between a deposited thickness distribution and a target thickness distribution.

In one embodiment, which may be combined with one or more of the before-addressed embodiments, said secondary magnet arrangement is different from said primary magnet arrangement. More particularly, no magnet of said secondary magnet arrangement is also a magnet of said primary magnet arrangement. In one embodiment, no magnet of said secondary magnet arrangement is also a magnet of said primary magnet arrangement with the exception of a back plate.

In one embodiment, which may be combined with one or more of the before-addressed embodiments, said secondary magnet arrangement is separate from said primary magnet arrangement.

In one embodiment, which may be combined with one or more of the before-addressed embodiments, said primary magnet arrangement forms a magnetic circuit separate from a magnetic circuit formed by said secondary magnet arrangement. In other words, said magnetron magnetic field is part of a magnetic circuit separate from a magnetic circuit of which said auxiliary magnetic field is part. Even more concretely, north and south poles of said primary magnet arrangement are separate from north and south poles of said secondary magnet arrangement.

In one embodiment, which may be combined with one or more of the before-addressed embodiments, said superposition is such that a magnetic field resulting from said superposition has a shape different from the shape of said magnetron magnetic field. In particular, the superposition is such that a section of a magnetic field resulting from said superposition aligned substantially parallel to said sputtering surface is larger than a section of said magnetron magnetic field aligned substantially parallel to said sputtering surface. I.e. the width of the range of plasma density can be increased.

In one embodiment, which may be combined with one or more of the before-addressed embodiments, the width of said cross-sectional arc of said auxiliary magnetic field is smaller than the width of said cross-sectional arc of said primary magnetic field.

In one embodiment, which may be combined with one or more of the before-addressed embodiments, said auxiliary magnetic field describes at least one tunnel-like shape having an arc-shaped cross-section, in particular describing substantially a closed loop.

In one embodiment, which may be combined with one or more of the before-addressed embodiments, said auxiliary magnetic field describes in the region where it superposes with said magnetron magnetic field substantially one single arc shape, in particular similar to the arc shape described by the magnetron magnetic field.

In one embodiment, which may be combined with one or more of the before-addressed embodiments, said magnetron sputtering source comprises said target arrangement.

The vacuum treatment apparatus comprises a magnetron sputtering source according to the invention, and it comprises a vacuum chamber in which said target arrangement is arranged, and a gas inlet system for introducing a sputtering gas or a reactive gas or both, a sputtering gas and a reactive, into said vacuum chamber.

In particular, said vacuum treatment apparatus is a vacuum treatment apparatus for coating substrates by means of magnetron sputtering.

In one embodiment, said primary magnet arrangement is arranged outside said vacuum chamber.

When in operation, said magnetron magnetic field and said auxiliary magnetic field are arranged in said vacuum chamber.

In one embodiment of the vacuum treatment apparatus, which may be combined with one or more of the before-addressed embodiments, said secondary magnet arrangement is arranged outside said vacuum chamber. Nevertheless, embodiments are possible in which said secondary magnet arrangement is arranged outside said vacuum chamber.

In one embodiment of the vacuum treatment apparatus, which may be combined with one or more of the before-addressed embodiments, said adjustment unit is operable from outside said vacuum chamber.

In one embodiment of the vacuum treatment apparatus, which may be combined with one or more of the before-addressed embodiments, the vacuum treatment apparatus comprises a pumping arrangement for evacuating said vacuum chamber.

The method for manufacturing coated substrates by magnetron sputtering using a magnetron sputtering source comprises the steps of a) generating close to a sputtering surface of a target a magnetron magnetic field describing one tunnel-like closed loop having an arc-shaped cross-section;

b) generating close to said sputtering surface an auxiliary magnetic field having a substantially arc-shaped cross-section, said auxiliary magnetic field superposing with said magnetron magnetic field and being substantially inversely polarized with respect to said magnetron magnetic field; and c) adjusting said auxiliary magnetic field.

In one embodiment, which may be combined with one or more of the before-addressed embodiments, step c) is carried out using an adjustment unit of said magnetron sputtering source.

In one embodiment, which may be combined with one or more of the before-addressed embodiments, step c) comprises adjusting said auxiliary magnetic field relative to said magnetron magnetic field In one embodiment, which may be combined with one or more of the before-addressed embodiments, step c) comprises adjusting said auxiliary magnetic field with respect to its shape.

In one embodiment, which may be combined with one or more of the before-addressed embodiments, step c) comprises adjusting said auxiliary magnetic field with respect to its position.

In one embodiment, which may be combined with one or more of the before-addressed embodiments, step c) comprises adjusting said auxiliary magnetic field with respect to its magnitude.

In one embodiment, which may be combined with one or more of the before-addressed embodiments, step c) comprises adjusting a relative position with respect to an axis substantially perpendicular to said target surface, of said primary magnet arrangement and of said primary magnet arrangement of at least a portion of said secondary magnet arrangement.

In one embodiment, which may be combined with one or more of the before-addressed embodiments, step c) comprises adjusting a current flowable through a coil.

In one embodiment, which may be combined with one or more of the before-addressed embodiments, the method comprises the step of f) generating said auxiliary magnetic field by means of a secondary magnet arrangement comprising N≥2 segments.

In one embodiment, which may be combined with one or more of the before-addressed embodiments, the method comprises the step of t) determining for at least one of said segments, how an adjustment of said segment influences thickness distributions obtainable by sputter-coating a substrate using said secondary magnet arrangement.

Preferably, step t) is carried out for several, in particular for all said segments.

In one embodiment, which may be combined with one or more of the before-addressed embodiments, in step t) it is determined how a change in position of said segment and/or how a change in current flowing in a coil of said segment influences said thickness distributions.

Knowing this, a prediction can be made as to how the auxiliary magnetic field should be adjusted in order to rather precisely achieve a target thickness distribution.

In one embodiment, which may be combined with one or more of the before-addressed embodiments, step t) is carried out in an at least partially, preferably fully automated fashion.

In one embodiment, which may be combined with one or more of the before-addressed embodiments, the method comprises the steps of g) providing that said segments are each in an initial adjustment state;

i) coating a substrate using said magnetron sputtering source with said segments in said initial adjustment states;

j) determining a thickness distribution of the coating obtained in step i);

for at least one of said N≥2 segments, in particular for several, more particularly for all said segments:

k) readjusting in a defined manner an adjustment state of said at least one segment;

l) coating a substrate using said magnetron sputtering source with the so-adjusted secondary magnet arrangement;

m) determining a thickness distribution of the coating obtained in step l);

n) determining a distribution function related to or indicative of a relation between the thickness distribution determined in step m) and the thickness distribution determined in step i);

o) weighting said distribution function determined in step n) with the defined readjustment mentioned in step k).

This allows to determine gauge functions for adjustments of said secondary magnet arrangement.

Steps j) and/or m) preferably comprise an in-situ coating-thickness measurement step.

In one embodiment, said adjustment states are descriptive of a geometrical position of a segment and/or descriptive of a current flowable through a coil of a segment.

Said relation between thickness distributions mentioned in step n) can, e.g., be a quotient of the two thickness distributions or a difference between these or the like.

In one embodiment, the distribution functions mentioned in steps j), m), n) and o) are distributions along a direction perpendicular to a surface normal of said sputtering surface and perpendicular to a direction of movement of samples during sputter coating.

One embodiment comprises carrying out at least steps g) to o) in an at least partially automated fashion.

In one embodiment, which may be combined with one or more of the before-addressed embodiments, the method comprises the step of p) using at least one weighted distribution function, in particular the at least one weighted distribution function obtained in step o), for determining new adjustment states of said segments for achieving a target thickness distribution.

This allows to continuously improve the coating results (in the sense of achieving coating results closer and closer to a target thickness distribution).

In one embodiment, which may be combined with one or more of the before-addressed embodiments, the method comprises the step of q) coating a substrate using said magnetron sputtering source with said segments in said new adjustment states.

In one embodiment, which may be combined with one or more of the before-addressed embodiments, the method comprises the step of r) iteratively or recursively carrying out steps p) and q).

This can allow to better and better achieve a target thickness distribution, iteratively improving the agreement between achieved thickness distribution and target thickness distribution.

The invention comprises methods with features of

The invention comprises apparatuses with features of corresponding methods according to the invention, and vice versa.

The advantages of the methods correspond to the advantages of corresponding apparatuses and vice versa.

Further embodiments and advantages emerge from the dependent claims and the figures.

BRIEF DESCRIPTION OF THE DRAWINGS

Below, the invention is described in more detail by means of examples and the included drawings. The figures show:

FIG. 3a a schematized illustration of a detail of a vacuum treatment apparatus with a secondary magnet arrangement comprising several segments, in a cross-sectional view, and a curve;

FIG. 3b a schematized illustration of a mechanical guiding appliance for a height-adjustable segment, in a side view;

FIG. 4 a schematized illustration of a detail of a vacuum treatment apparatus with a secondary magnet arrangement comprising several segments, in a cross-sectional view, and a several gauge curves $W_k(y)$;

FIG. 8a a schematized illustration of a top-view onto a magnet system of a round magnetron;

FIG. 8b a schematized illustration of a side-view of a magnet system of a round magnetron;

The reference symbols used in the figures and their meaning are summarized in the list of reference symbols. The described embodiments are meant as examples and shall not confine the invention.

DETAILED DESCRIPTION OF THE INVENTION

Figure 1:
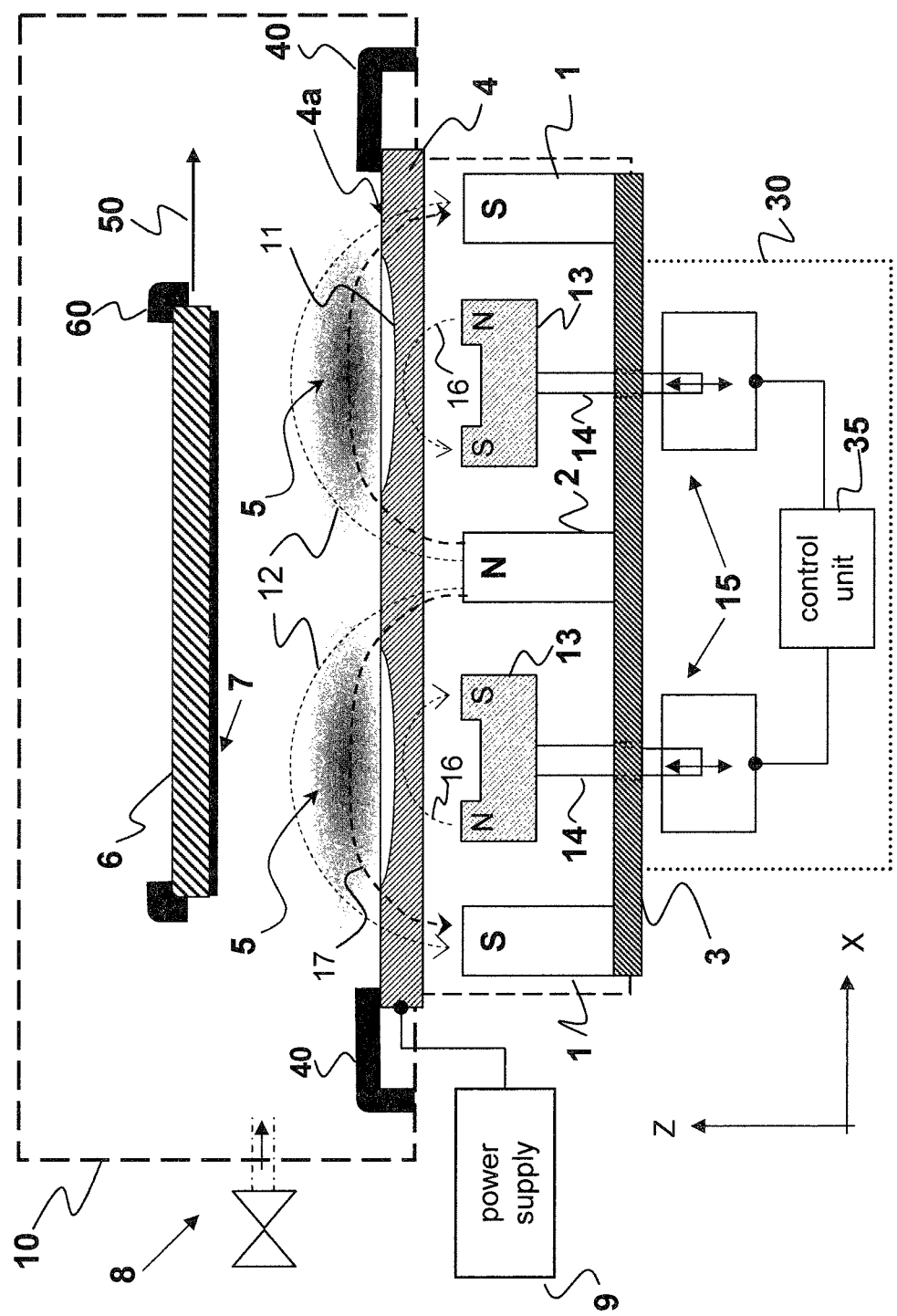
FIG. 1 a schematized illustration of a vacuum treatment apparatus with a secondary magnet arrangement externally adjustable with respect to its position, in a cross-sectional view.

FIG. 1 shows a schematized illustration of a vacuum treatment apparatus with a secondary magnet arrangement 13 externally adjustable with respect to its position (along coordinate axis z; target surface 4a being aligned parallel to plane x-y), in a cross-sectional view. Several components of the vacuum treatment apparatus and their functions have been described before in the discussion of the state of the art; for the sake of conciseness, this will not all be repeated here.

Primary magnet arrangement 1,2 generates a magnetron magnetic field (field lines referenced as 12), part 1 of the primary magnet arrangement forming an outer closed loop of magnets, part 2 an inner line of magnets.

Secondary magnet arrangement 13 is arranged between part 1 and part 2 generating an inversely polarized auxiliary magnetic field (field lines referenced as 16). In a very simple case, the secondary magnet arrangement 13 can comprise two or more horizontally aligned permanent magnets or yoke-shaped permanent magnets.

Figure 9:
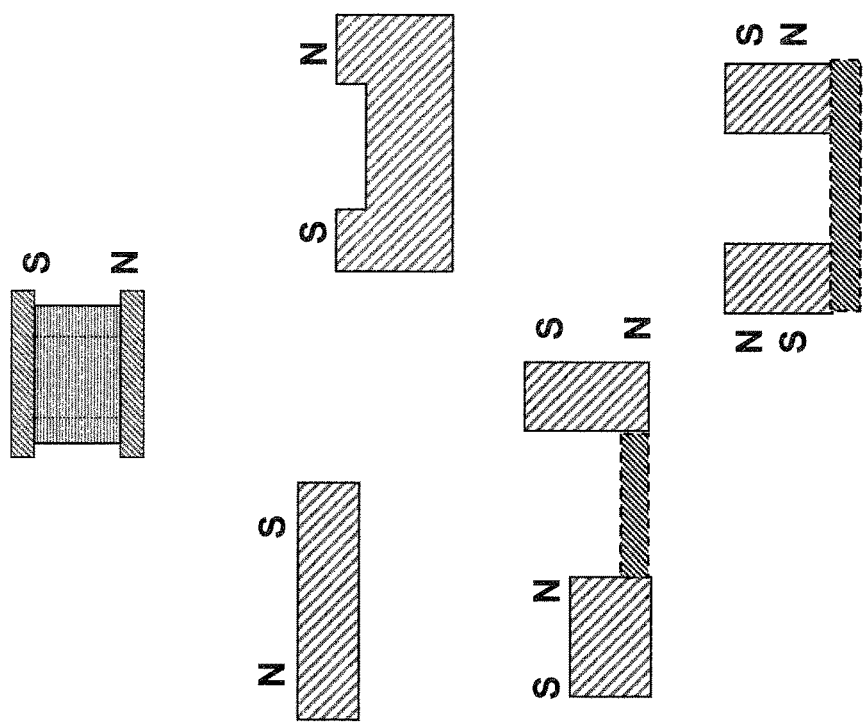
FIG. 9 a schematized illustration of several examples of segments for secondary magnet arrangements.

FIG. 9 shows several exemplary segments of which secondary magnet arrangement 13 can be composed. Each segment may comprise one or more permanent magnets, one or more shunts and/or one or more coils. The upper-most example comprises a coil on a shunt, the lower two examples each comprise two permanent magnets connected by a shunt.

Using pairs of oppositely-polarized permanent magnets interconnected by a shunt or ferromagnetic back plate (cf. lower-most example in FIG. 9) allows to efficiently optimize the magnetic field above the target 4, thus achieving a particularly broad area with field lines 17 of the superposition of the magnetron magnetic field (cf. 12 in FIG. 1) and the auxiliary magnetic field (cf. 16 in FIG. 1) substantially parallel to the target surface 4a. The movement of the segments of the secondary magnet arrangement 13 is preferably carried out in a precise way, so as to achieve a precise and well-controlled thickness distribution of a coating 7 on a substrate 6. In practice, it is advantageous to provide an adjustment precision of better than ±1 mm or rather of the order of ±0.1 mm or better. This can be achieved, e.g., by external units 15 for mechanical displacement mechanically connected to the segments of the secondary magnet arrangement 13 via rigid mechanical connections 14 functioning as guidances 14 for the segment movement. Units 15 belong to an adjustment unit 30 and have to ensure a reproducible precise shifting of the segments. For example, a unit 15 can be or comprise a micrometer screw with an adjustment scale or, preferably, comprise a stepper motor. Adjustment unit 30 further comprises a control unit 35 which controls the units 15.

Units 15 are, as shown in FIG. 1 and FIG. 3a, preferably mechanically connected (coupled) to ferromagnetic back plate 3 of primary magnet arrangement 1,2, so as to provide a geometrically well-defined positioning of the segments of secondary magnet arrangement 13 with respect to the primary magnet arrangement 1,2, thus ensuring that the resulting magnetic field above the target 4 is (in shape and strength) as little as possible influenced by external influences. Note that in FIG. 3a, five segments M1, M3, M5, M7, M9 of the secondary magnet arrangement 13 are shown.

Preferably, the z-movement of each segment is accomplished by means of a micrometer screw aligned along the z-axis, as shown in FIG. 3b, which shows in a side view a schematized illustration of a mechanical guiding appliance 19 for a segment M1. This, because strong forces in z-direction are exerted on the segments of the secondary magnet arrangement 13 which result from magnetic interactions with magnets of the primary magnet arrangement 1,2. Because of these forces, the screw is always mechanically stressed (usually tensile stress), which advantageously results in the fact that no mechanical play exists when moving the segments for adjusting their z-position. This ensures a great reproducibility of the z-movements of the segments.

Furthermore, it is also advantageous to provide the segments of the secondary magnet arrangement 13 with at least one additional mechanical guidance 19 for the linear movement along the z-direction, since in case of different adjustments for neighboring segments, torques and forces will occur because of magnetic interactions between these segments, said torques and forces resulting, in case of a non-specific mechanical guidance, in a turning, a tilting or a shifting of the segments, which can result in the movement mechanics getting stuck or in a non-reproducible adjustment of the segment position or in a change of the magnetic field (in particular its shape) due to a tilt of a segment. The mechanical guidance can be realized by one or more pins in conjunction with corresponding holes in the segment, see FIG. 3b (reference 19 and segment M1).

The screws 18 are preferably realized with precise micrometer threads small thread pitch (typically 0.1 to 1 mm path per turn), so as to ensure a sufficient precision. In addition, the screws 18 can be provided with readable scales, so as to allow an adjustment as reproducible as possible. The screws can also be operable by a motor, wherein stepper motors are particularly suited, by means of which precise and reproducible changes of the rotation angle of their driving axle can be accomplished.

In order to achieve a locally variable adjustability of the deposition rate across the target, the movements of the segments of the secondary magnet arrangement 13 (each segment having a certain length) have to be controllable independently. The finer the segmentation of the secondary magnet arrangement 13, the more precisely the local field strength can be adjusted, i.e. a precise adjustability of the local deposition rate necessitates a large number of short segments. In practice, nevertheless, the number of segments will be limited in order to keep the efforts for the adjustment manageable. In order to achieve a high target utilization, the secondary segments (be it permanent magnets or shunts or coils or combinations thereof) will usually be located several millimeters behind the target. The distance to the region 5 of high plasma density located several millimeters above the target typically amounts to 15 to 30 mm, in which case a thickness of the target arrangement (target 4 including a cooling plate not shown in the figures) of 10 to 15 mm has been assumed.

Because of the distance of the segments (M1, M3, M5, M9, see FIG. 3a) to the region 5 of high plasma density, a shift along z of a segment results in an effect affecting the magnetic field above the target 4 over a length along y which is significantly larger than the physical length b (along y) of the shifted segment (cf. FIG. 3a).

The upper part of FIG. 3a illustrates the effect that a movement of a segment (segment M5) can have in terms of changes t' in a coating thickness distribution resulting therefrom (when coating a substrate). The change t' in the coating thickness distribution (comparing thickness distributions of coatings deposited before and after the movement of the segment) results from a change in the deposition rate distribution. In the illustration of FIG. 3a, it is assumed that the substrate 6 is moved across the target along x during the sputter coating. The change t' in the coating thickness distribution has a maximum above the middle of the segment M5, decreasing with increasing distance in y-direction from that middle. The wide extension of the t' curve comes about from the physical width b of the segment (M5) and an instrinsic quantity w which comes about from the extension of the magnetic field (along y) of segment M5 (above the target surface) and the three-dimensional sputtering effect of target material because of the ions from the plasma region above the target 4. The value of the quantity w can be used as a lower limit for a selection of a physical width of the segments. The extension (along y) of the effect of shift (along z) of a segment amounts to at least 2 w along the y-axis, independent of the physical width of the segment.

For the case of a rectangular magnetron (cf., e.g., FIG. 2a) having a target width (along x) of 12.5 cm and a length (along y) of 62 cm, a value of 60 to 70 mm results for the intrinsic quantity (intrinsic width) w. In case of that example, it makes sense to use segments of a width (along y) of 60 to 70 mm.

Figure 2B:
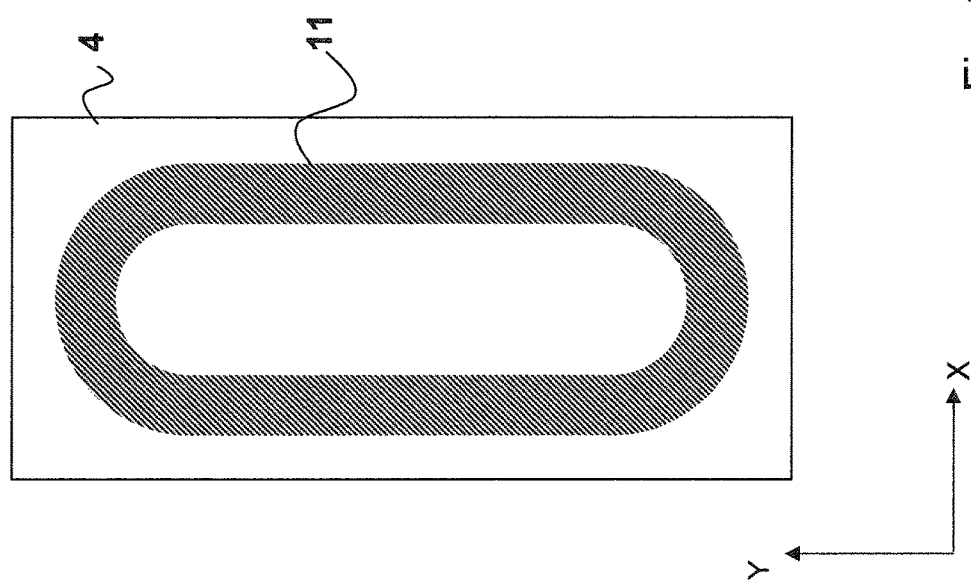
FIG. 2b a schematized illustration of a top-view onto an erosion area (race track) on a target of a rectangular magnetron.

Considering the fact that the uniformity of the coating thickness strongly decreases towards both edge regions (in y) of the magnetron (corresponding to the curves of the race track 11, cf. FIG. 2a, 2b), and that for this reason, for the above-sketched exemplary case, a width of only ±20 cm around the middle of the target 4 can be used for obtaining a uniform coating of substrates, a number of 5 to maximum approximately 8 segments (distributed along y) results as a suitable number of segments per side (left L and right R, respectively, of the magnetron) for correcting the coating thickness profile.

Figure 2A:
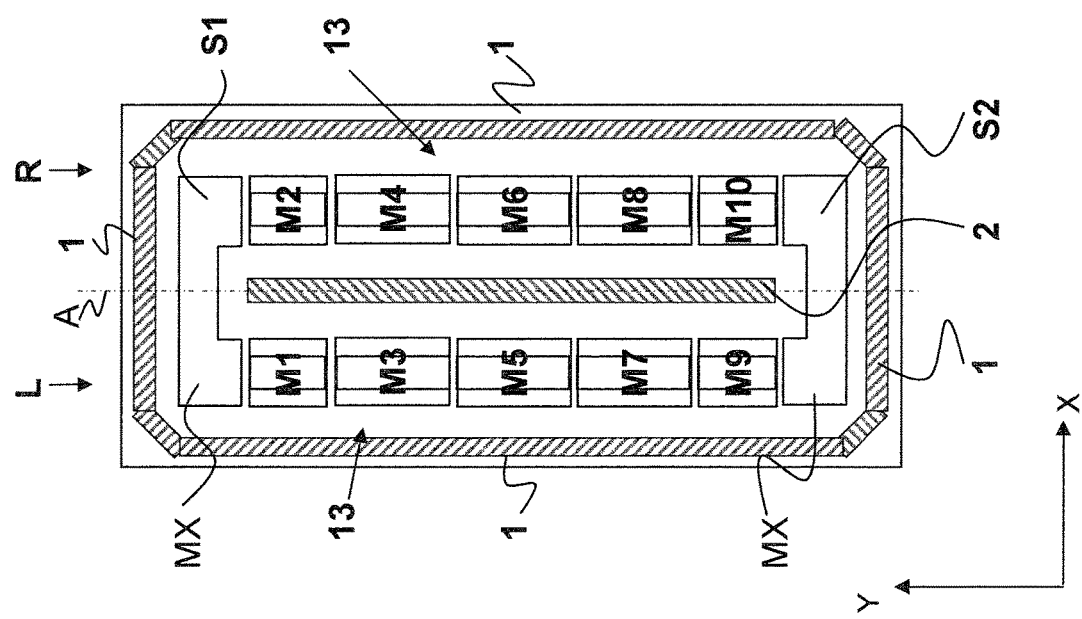
FIG. 2a a schematized illustration of a top-view onto a magnet system of a rectangular magnetron with a segmented secondary magnet arrangement.

The length (along y) of these segments does not necessarily have to be identical, see, e.g., FIGS. 2a, 3a, 4. As experience has shown, the field distribution in the middle of a magnetron changes less than near its ends, for which reason it can be advantageous to choose a larger length of the segments near the middle of the magnetron and a smaller length towards the ends of the magnetron (with respect to the y direction), as shown in FIGS. 2a, 3a.

The left region L and right region R (cf., e.g., FIGS. 2a, 6b and 7) of a linear magnetron contribute equally to the deposition rate if the segments on the left (L) and right (R) are adjusted equally with respect to their position. For an improved and more precise adjustability of the coating thickness distribution, it can be advantageous to shift the y-locations of the segments on the left (L) with respect to the y-position of the segments on the right (R) by an offset Δ (see FIG. 7). Accordingly, the set of segments in the left region L, i.e. M1, M3, M5, M7, M9, is arranged with respect to a symmetry plane A of the primary magnet arrangement 1,2 in a non-symmetrical manner with respect to the set of segments in the right region R, i.e. M2, M4, M6, M8 M10. This way, the influences on the coating thickness distribution of the different sets of segments on the left L and right R of the magnetron, respectively, affect the coating thickness distribution at shifted locations (with respect to the y position). This makes particularly much sense in the case of substrates being moved in x direction during the coating. The magnets MX shown, e.g., in FIG. 7, which are located close to the ends of the magnetron, can be dispensed with, in which case part 1 of the primary magnet arrangement will usually be configured accordingly. In some Figures, no magnets MX are shown, accordingly. If present, magnets MX will in many cases be not adjustable and, accordingly not contribute to the adjustability of the auxiliary magnetic field. Magnets MX will rather be shunts than permanent magnets.

In the following, a method for specifically correcting a coating thickness distribution will be discussed, more specifically, a method for specifically correcting a coating thickness distribution by means of externally adjustable positions (with respect to a direction perpendicular to the target surface, i.e. along z) of segments of a secondary magnet arrangement 13, in particular a method accomplishing this at substantially constant target use.

Figure 5:
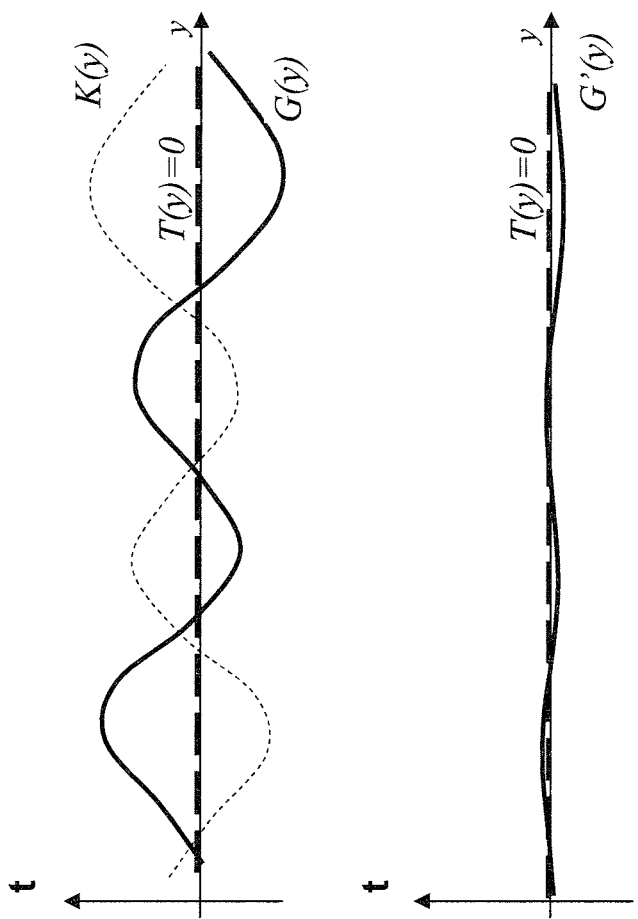
FIG. 5 a coating thickness profile $G(y)$ on a substrate, a calculated thickness correction profile $K(y)$, and a coating thickness profile $G'(y)$ obtained after applying corresponding corrections.

Firstly, the z-positions of the segments are adjusted for reaching an initial position each, in particular a pre-defined initial position, see, e.g., FIG. 4, segments M1, M3, M5, M7, M9. With these initial positions, a resulting basic thickness distribution G(y) is determined by coating a substrate and measuring, e.g., by reflection or transmission measurements or other suitable methods, preferably in-situ methods. FIG. 5 shows such an exemplary basic distribution G(y).

In order to achieve a calibration, the z-position of a segment k ($M_k$) is readjusted (shifted) in a defined way by a value $p_k$ (a length, along z), and the relative change $V_k(y)$ in the coating thickness distribution is determined, e.g., by dividing a coating thickness distribution obtained with segment k readjusted as described by the basic distribution G(y). $V_k(y)$ is then divided by the shift $p_k$. The resulting distribution function $$W_k(y) = \frac{1}{p_k} \cdot V_k(y)$$

is a gauge function for the influence of segment k on the thickness distribution. Such a calibration function is determined for each of the segments of the secondary magnet arrangement 13. FIG. 4 schematically shows in its upper portion several such gauge functions. Of course, before determining a gauge function for another segment, the formerly readjusted segment is repositioned to its initial position, so as to really separate the influence of the currently examined segment from the influences of all other segments and to base on the same set of initial positions. The so-determined gauge functions $W_k(y)$ are used for calculating adjustments required in the future for carrying out specific corrections.

With $s_k$ a set of adjustments (shifts along z) of the segments, a correction or change of the distribution of approximately $$K(y) = \sum_k s_k \cdot W_k(y).$$

results. A new thickness distribution S(y) achievable with a set $s_k$ of adjustments (shifts) can, accordingly, be obtained as the sum of basic distribution G(y) and correction K(y):

$$S(y)=G(y)+K(y)$$

When a given target thickness distribution T(y) has to be achieved, the values $s_k$ can be found by means of a mathematical optimization method, in particular one which minimizes the differences between the resulting thickness distribution S(y) and the target distribution T(y). E.g., this can be formulated as a minimization of the following sum r of the differences over all positions y $$r = \sum_{Pos.y} \left( G(y) + \sum_k s_k \cdot W_k(y) - T(y) \right)^2$$

which has to be as small as possible; or a corresponding integral can be minimized. Solving this mathematical optimization problem means obtaining a set of values $s_k$ which shall be used as correcting adjustments of the segment-z-positions for a subsequent coating process. Using these positions, a coating will be produced, and its thickness distribution function, referred to as new thickness distribution function G'(y), will be determined (by measuring). G'(y) will be much more similar to target distribution function T(y) than G(y). FIG. 5 shows, in its lower portion, an example where T(y)=0 was assumed.

It is now preferably possible to iteratively apply the above-described method to G'(y), so as to further optimize deviations of obtained distributions from the target distribution. In other words, using the new G'(y) in the way G(y) has been used above, another set of corrections (with usually much smaller readjustments than the former set $s_k$)—which are now position changes with respect to the most recently used positions—can be determined and applied to the recent-most positions, so as to approximate T(y) better and better. Additional drifts and changes in the (relative) thickness distribution function of the coating process possibly occurring will be, by means of the above-described method, corrected quasi-continuously, namely after each newly-determined new set of adjustments, which can be after each substrate coating, or only after every m'th coating has been produced, with m=2 or 5 or 10 or more, depending on the quality requirements and the process stability.

Figure 10:
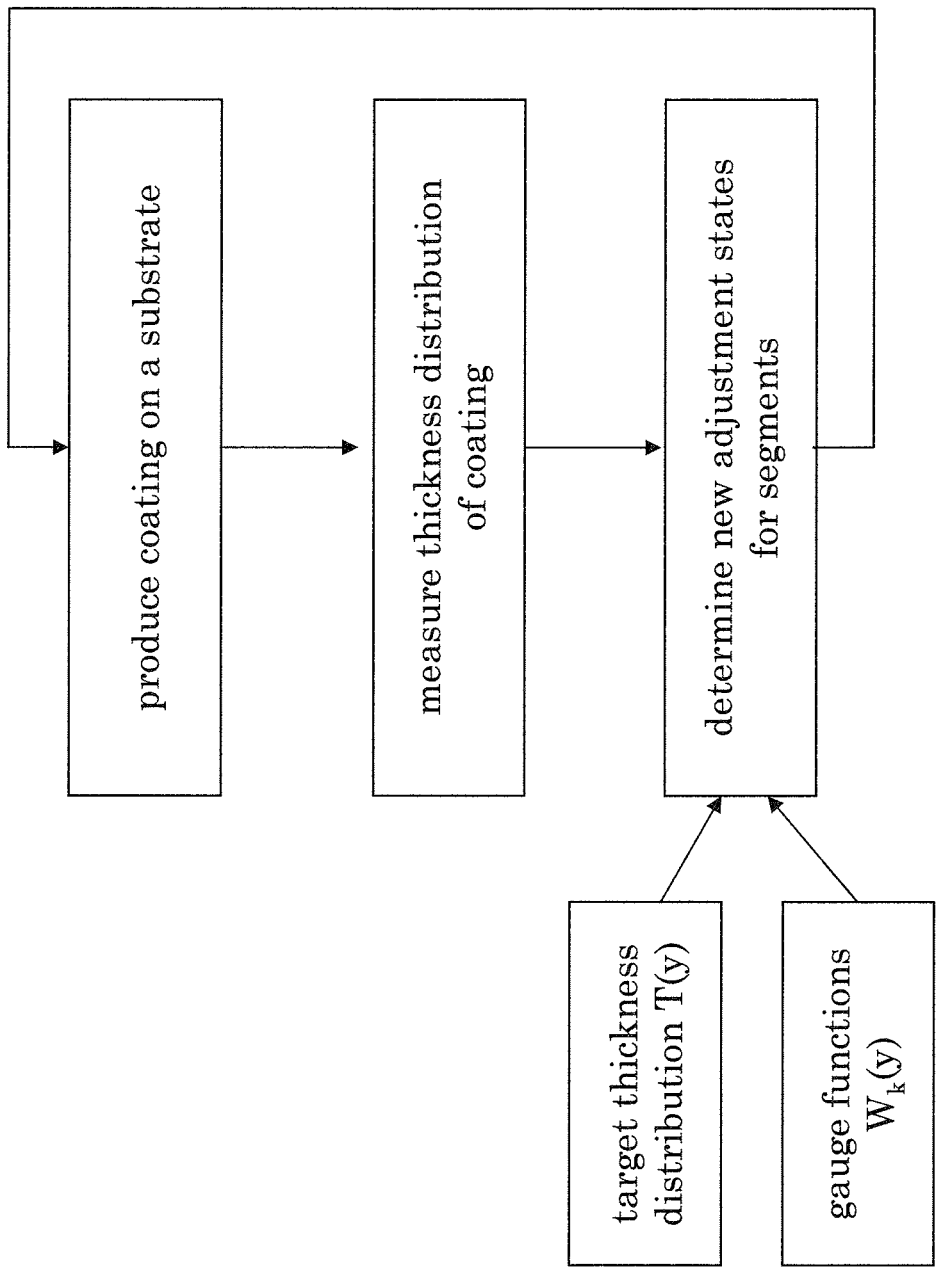
FIG. 10 a block-diagrammatical illustration of a method for iteratively optimizing the agreement between an actual thickness distribution and a target thickness distribution.

FIG. 10 shows a block-diagrammatical illustration of a method for iteratively optimizing the agreement between an actual thickness distribution and a target thickness distribution.

It is, of course, also possible to iteratively repeat the gauging, in particular in the sense that, once a quite reasonable agreement between actual thickness distribution and target thickness distribution has been achieved (in the above-described way), the corresponding positions are used as initial positions for another gauging procedure, in which for each of the segments the influence of a z-position change of the corresponding segment is determined, such as to yield improved gauge functions.

Of course, it is not possible to produce any arbitrary distribution function T(y) using the above-described procedure; the target distribution function T(y) has to be at least approximately composable of the gauge functions $W_k(y)$ of the segments. The target distribution functions may not strongly change within a width comparable to the width given by the above-discussed intrinsic width $w_k$ (index k designating each segment). The probably most often requested case also having the greatest relevance in practice, namely the case of a uniform distribution, i.e. T(y)=0, has these properties and therefore is well susceptible to optimizations of the above-described kind.

The correction of coating thickness distributions as mainly discussed so far is accomplished mainly by locally changing the magnetic field strength in the region of high plasma density above the target. Since the corrections are usually in the range of 0% to 10%, it can be assumed with a reasonable degree of precision that the interrelation between the (z–) position of the segments of the secondary magnet arrangement 13 and the corresponding changes in the thickness distribution function are (in a first approximation) linear. When the above-described method is carried out iteratively, the deviation between actually obtained distribution G'(y) and target distribution T(y) will be smaller step by step, and accordingly, the precision of the linear approximation will be increasing.

Figure 6A:
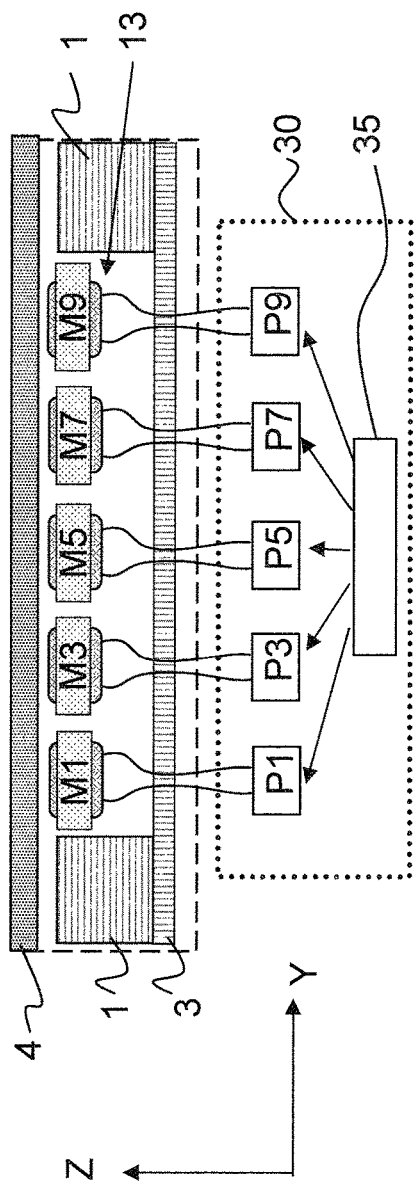
FIG. 6a a schematized illustration of a magnet arrangement comprising a secondary magnet arrangement comprising several coils with shunts, in a cross-sectional view.
Figure 6B:
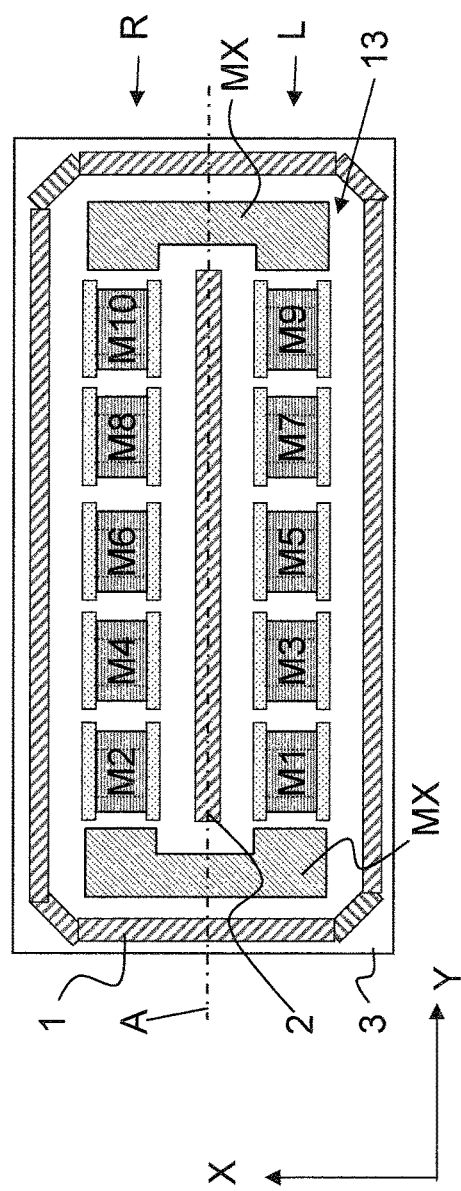
FIG. 6b a schematized illustration of a magnet arrangement comprising a secondary magnet arrangement comprising several coils with shunts, in a top view.
Figure 7:
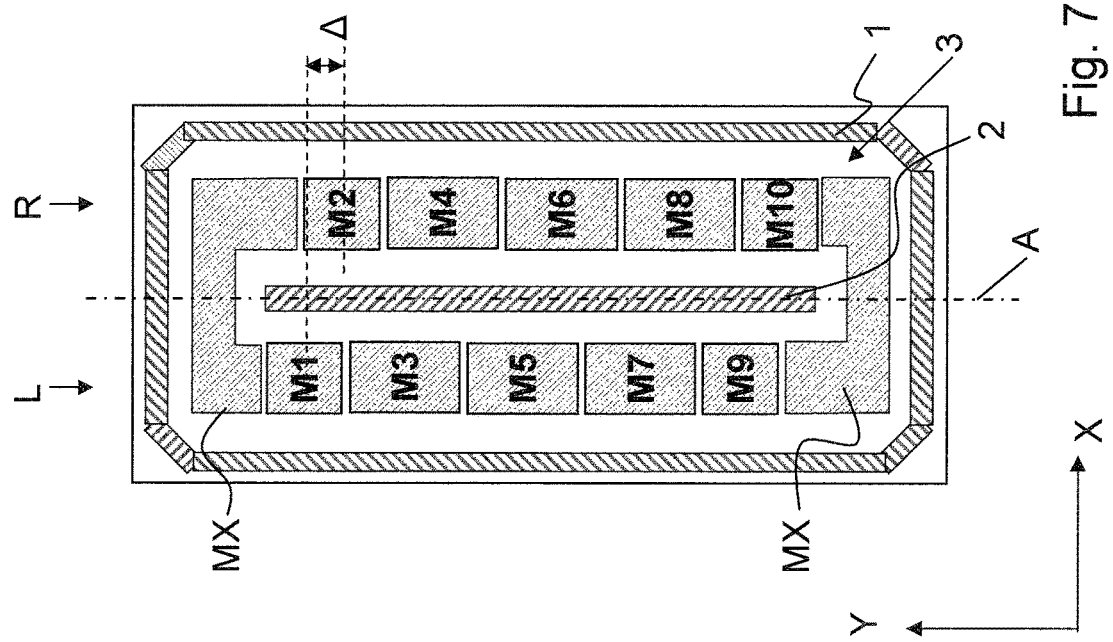
FIG. 7 a schematized illustration of a top-view onto a magnet system of a rectangular magnetron comprising a segmented secondary magnet arrangement with non-symmetrically arranged segments.

Instead of changing the magnetic field in the region 5 of high plasma density by changing the z-position of the segments of the secondary magnet arrangement 13, one can also do so by means of electromagnets, i.e. by means of coils, see FIGS. 6a and 6b, through which an adjustable current flows. Around shunts (ferromagnetic material) generating an auxiliary magnetic field, wire can be wound, i.e. the shunts can be provided with a coil each. When no electric current flows through a coil, the corresponding shunt has its usual effect of flattening the magnetic field lines above the target. By means of current flowing through the coil, an additional magnetic field is induced in the shunt which superposes with the field of magnetization induced in the shunt (from the magnetron magnetic field). Since for the correction of distribution functions, magnetic field strengths of the order of some percent are needed, while the absolute field strength of the magnetron magnetic field is in the range of ten Gauss to several hundred Gauss, it is mostly sufficient to provide changes of the magnetic field strength in the range of about 1 to 10 Gauss. Magnetic fields of this order of magnitude are easily generatable by means of coils. An advantage of controlling the auxiliary magnetic field for thickness distribution corrections is, that a correction can be accomplished by setting electrical currents in the power supplies (in FIG. 6a: P1, P3, P5, P7) and therefore without a mechanical movement having to take place. The above-mentioned parameters (adjustments) $s_k$ therefore correspond to electric currents (in the coils) in this case.

The above-described methods not only offer the possibility of manual corrections during the coating process, it also enables, via a suitable control system, an automated correction of the distribution. This will be described by means of the example of changing the auxiliary magnetic field by means of coils. For this, an in-situ registration of the thickness distributions during the coating process, more particularly without breaking the vacuum in the vacuum chamber, is recommended and can even be considered required. It is not necessary, but possible, that a coating is measured while it is still being deposited. When one coating is deposited in several subsequent coating steps (partial coatings), as it is for example often the case when substrates are arranged on a rotating drum so as to periodically have them located close to the high-density plasma region and the target, it is well possible to determine thickness distributions also of the not-yet completed coatings, namely between two of such partial depositions. In such cases, it is even possible to carry out correcting adjustments in the time between the first and the last partial deposition, based on the thickness distributions of those not-yet completed coatings. This allows to very precisely achieve a target thickness distribution. In any event, it is desirable to have coating thicknesses available soon after a coating is completed and without having to break the vacuum in the process chamber.

From a measured thickness distribution, new adjustments $s_k$ for the secondary magnet arrangement will be obtained (which in this case represent coil currents) using a computer-executed algorithm implementing the above-described optimization method, and these adjustments $s_k$ are automatically fed to the power supplies of the coils. Of course, coils do not represent the sole possibility for carrying out the correction process in a remote-controlled automated fashion. E.g., the z-movement of the segments of the secondary magnet arrangement 13 can be accomplished via suitable mechanical drives and individual motors, which are controlled by a control unit 35 (FIGS. 1, 3a, 4, 6a), wherein control unit 35 is part of adjustment unit 30 and receives data (data descriptive of a thickness distribution) from a thickness measuring system (not shown); and control unit 35 may also carry out the computing tasks required for the optimization process.

The external adjustability of the segmented secondary magnet arrangement is, of course, not limited to rectangular magnetrons, but can also applied to other magnetrons such as round (circular) magnetrons. Such a round magnetron is illustrated in FIGS. 8a and 8b.

In case of such round magnetrons, the complete magnet system (primary magnet arrangement 1,2 and secondary magnet arrangement 13) is frequently kept, during operation, in a rotating movement around an axis 20 through the middle of the round target 3, so as to achieve a rotationally symmetric high erosion off the target and a high coating thickness uniformity in azimuthal direction on the substrates. An exemplary magnet configuration of such a magnetron is schematically shown in FIGS. 8a, 8b.

Like in the case of a rectangular magnetron, a high plasma density forms above the target in a region describing a closed curve. Due to the rotation of the magnet system that high plasma density region continually rotates above the target surface and thus leads to a rotationally symmetric erosion of target material and to a corresponding deposition on a substrate above the target. The thickness distribution in radial direction, however, can show an undesired deviation from a desired target distribution (typically flat, i.e. maximum homogeneity). By means of shunts or permanent magnets which are adjustable with respect to their z-position (or with coils fed by adjustable power supplies), the erosion rate can be, in analogy to the methods discussed above for a rectangular magnetron, influenced or adjusted. Like in the case of the rectangular magnetron, the adjustment can be accomplished from the outside (from external to the process chamber), but for practical reasons, it will usually be preferred to stop the rotational movement for doing so. The interrelation between position of segment (or current flowing through coil) is, because of the rotational movement of the magnet system, more complicated, but, like in the case of the rectangular magnetron, a gauging is possible by specifically adjusting the adjustment states (i.e. the positions and/or currents) of the segments.

We can summarize that a magnetron sputtering source is used which comprises a primary magnet arrangement having an inner part 1 and an outer part 2 and a secondary magnet arrangement 13, wherein a change or adjustment of the resulting magnetic field (field lines referenced as 17) above the target 4 is accomplished by shifting one or more (preferably all) segments of the secondary magnet arrangement relative to the primary magnet arrangement 1,2 towards the target 4 or away therefrom, i.e. along the z-axis (cf. FIG. 3). The resulting magnetic field above the target is weakened in case of segments closer to the target and strengthened in case of segments farther away from the target. Accordingly, the deposition rate will locally be lower and higher, respectively.

A change in position of the segments of the secondary magnet arrangement 13 has direct influence on the form (shape) of the resulting magnetic field (more precisely: of the shape of the field lines 17 of the resulting magnetic field) and also on the local field strength. Since the segments are positioned such that they cause the flat shape of the field lines 17 above the target 4 needed for the improved target utilization, a small position shift in z direction of the segments changes the shape of the field lines 17 above the target 4 only slightly, such that the target utilization is, in a first approximation, hardly influenced. On the other hand, by means of said small position shift in z direction of the segments, the field strength (which is an absolute value) changes locally in a substantial way. As a consequence, the plasma density changes locally and, accordingly, the local ion density relevant for the sputtering process changes. The deposition rate on the substrate is thus influenced locally and changes locally the resulting coating thickness. Since the change of the plasma density takes place only locally, the voltage of the plasma discharge changes only insubstantially, and, accordingly, the average deposition rate across the magnetron sputtering source changes only insubstantially.

The segments of the secondary magnet arrangement 13 are preferably moved by suitable mechanical means, which are accessible directly from the outside of the cathode, i.e. their position can be controlled from the outside while the vacuum chamber 10 remains closed (and vacuumized). This is facilitated if the segments are located outside the vacuum chamber 10.

As an alternative for changing an adjustment state of a secondary magnet arrangement 13 or of a segment thereof, the use of coils and electromagnets, respectively, has been described. Of course, one can also combine z-movements of segments and adjustable currents flowing through coils of the segments.

Of course, it is also possible to carry out the invention in case of stationary substrates, i.e. substrates that are, during at least most of their deposition time, substantially fixed in position with respect to the target 4. In this case, the thickness distributions will preferably be two-dimensional distributions (along x and y).

The invention can allow to locally change thickness distributions (on a coated substrate) and deposition rate distributions (achievable with the target).

Aspects of the embodiments have been described in terms of functional units such as control unit 35 and adjustment unit 30. As is readily understood, these functional units may be realized in virtually any number of hardware and/or software components adapted to performing the specified functions.

LIST OF REFERENCE SYMBOLS

1 first part of primary magnet arrangement
2 second part of primary magnet arrangement
3 back plate, ferromagnetic back plate
4 target, sputtering target
4a target surface
5 region of high plasma density
6 substrate, workpiece
7 coating, film
8 gas inlet
9 power supply (for plasma discharge)
10 vacuum chamber, process chamber
11 target erosion trench, race track
12 magnetic field lines (of magnetron magnetic field)
13 secondary magnet arrangement
14 guidance for segment movement
15 unit for mechanical displacement
16 magnetic field lines (of auxiliary magnetic field)
17 magnetic field lines (of magnetic field of superposition)
18 micrometer screw, thread
19 mechanical guidance, guiding appliance
20 axis of rotation (of magnet system)
30 adjustment unit
35 control unit
40 target mount
50 direction of movement of substrate
60 substrate transport means
A symmetry plane
b (physical) width of segment
L left region
M1, . . . , M10, MX segments, magnets
N north, north pole
P1, . . . , P9 power supplies
R right region
S south, south pole
S1, S2 shunts
t thickness, coating thickness
t' change in thickness, change in coating thickness
x, y, z coordinates
$w, w_k$ intrinsic quantity, intrinsic width
$\Delta$ offset

The invention claimed is:

1. Magnetron sputtering source comprising
   a target mount for mounting a target arrangement comprising a sputtering target having a sputtering surface;
   a primary magnet arrangement for generating close to said sputtering surface a magnetron magnetic field describing one tunnel-like closed loop having an arc-shaped cross-section, wherein the primary magnet arrangement includes a first part and a second part with the magnetron magnetic field formed therebetween; and
   a secondary magnet arrangement having at least two segments for generating close to said sputtering surface an auxiliary magnetic field having a substantially arc-shaped cross-section, said auxiliary magnetic field superposing with said magnetron magnetic field and being substantially inversely polarized with respect to said magnetron magnetic field,
   wherein the secondary magnet arrangement is located between the first part and the second part of the primary magnet arrangement, the secondary magnet arrangement enclosing the second part of the primary magnet arrangement and the at least two segments of the secondary magnet arrangement being arranged asymmetrically about an axis extending longitudinally through the second part of the primary magnet arrangement,
   wherein the auxiliary magnetic field is generated within the tunnel-like closed loop of the magnetron magnetic field,
   wherein said magnetron sputtering source comprises an adjustment unit for adjusting said auxiliary magnetic field,
   wherein the closed loop of the magnetron magnetic field is arranged along said sputtering surface, and
   wherein the magnetron magnetic field forms an erosion trench on the target, the erosion trench having a shape of the tunnel-like closed loop.

2. The magnetron sputtering source according to claim 1, wherein said adjustment unit is an adjustment unit for adjusting said auxiliary magnetic field relative to said magnetron magnetic field.

3. The magnetron sputtering source according to claim 1, wherein said adjustment unit is an adjustment unit for adjusting said auxiliary magnetic field with respect to its shape.

4. The magnetron sputtering source according to claim 1, wherein said adjustment unit is an adjustment unit for adjusting said auxiliary magnetic field with respect to its position.

5. The magnetron sputtering source according to claim 1, wherein said adjustment unit is an adjustment unit for adjusting said auxiliary magnetic field with respect to its magnitude.

6. The magnetron sputtering source according to claim 1, wherein said adjustment unit is an adjustment unit for adjusting a relative position with respect to an axis substantially perpendicular to said target surface, of said primary magnet arrangement and of said primary magnet arrangement of at least a portion of said secondary magnet arrangement.

7. The magnetron sputtering source according to claim 1, wherein said secondary magnet arrangement comprises at least one coil, and wherein said adjustment unit is an adjustment unit for adjusting a current flowable through said coil.

8. The magnetron sputtering source according to claim 1, wherein said secondary magnet arrangement is segmented comprising at least two segments which can be adjusted independently from each other by means of said adjustment unit.

9. The magnetron sputtering source according to claim 1, wherein said secondary magnet arrangement is different from said primary magnet arrangement.

10. The magnetron sputtering source according to claim 1, wherein said primary magnet arrangement forms a magnetic circuit separate from a magnetic circuit formed by said secondary magnet arrangement.

11. The magnetron sputtering source according to claim 1, wherein said superposition is such that a magnetic field resulting from said superposition has a shape different from the shape of said magnetron magnetic field.

12. The magnetron sputtering source according to claim 1, wherein said magnetron sputtering source comprises said target arrangement.

13. Vacuum treatment apparatus comprising a magnetron sputtering source according to claim 1, and comprising a vacuum chamber in which said target arrangement is arranged, and a gas inlet system for introducing a sputtering gas or a reactive gas or both, a sputtering gas and a reactive, into said vacuum chamber.

14. The vacuum treatment apparatus according to claim 13, wherein said secondary magnet arrangement is arranged outside said vacuum chamber.

15. Vacuum treatment apparatus according to claim 13, wherein said adjustment unit is operable from outside said vacuum chamber.

16. Vacuum treatment apparatus according to claim 13, comprising a pumping arrangement for evacuating said vacuum chamber.

17. Method for manufacturing coated substrates by magnetron sputtering using a magnetron sputtering source, said method comprising the steps of
a) generating close to a sputtering surface of a target a magnetron magnetic field describing one tunnel-like closed loop having an arc-shaped cross-section;
b) generating close to said sputtering surface an auxiliary magnetic field having a substantially arc-shaped cross-section within the tunnel-like closed loop of the magnetron magnetic field, said auxiliary magnetic field superposing with said magnetron magnetic field and being substantially inversely polarized with respect to said magnetron magnetic field, and said auxiliary magnetic field being generated by a secondary magnet arrangement comprising at least two segments; and
c) coating a substrate using said magnetron sputtering source with said at least two segments in initial physical states;
d) determining a thickness distribution of the coating obtained in step c);
for at least one of said at least two segments:
e) adjusting a physical state of said at least one segment, thereby adjusting said auxiliary magnetic field;
f) coating the substrate using said magnetron sputtering source with said at least one segment and said auxiliary magnetic field as adjusted in step e);
g) determining a thickness distribution of the coating obtained in step f);
h) determining a distribution function related to a relationship between the thickness distribution determined in step g) and the thickness distribution determined in step d; and
i) weighting said distribution function determined in step h) according to the adjustment of step e);
j) using the weighted distribution function obtained in step i) to determine physical states of said at least two segments for achieving a target thickness distribution;
k) adjusting physical states of said at least two segments according to the physical states determined in step j), thereby adjusting said auxiliary magnetic field;
l) coating the substrate using said magnetron sputtering source with said segments as adjusted in step k); and
m) iteratively or recursively carrying out steps j), k), and l),
wherein the closed loop of the magnetron magnetic field is arranged along said sputtering surface, and
wherein the magnetron magnetic field forms an erosion trench on the target, the erosion trench having a shape of the tunnel-like closed loop.

18. The method according to claim 17, wherein step k) is carried out using an adjustment unit of said magnetron sputtering source.

19. The method according to claim 17, wherein step k) comprises adjusting said auxiliary magnetic field relative to said magnetron magnetic field.

20. The method according to claim 17, wherein step k) comprises adjusting said auxiliary magnetic field with respect to its shape.

21. The method according to claim 17, wherein step k) comprises adjusting said auxiliary magnetic field with respect to its position.

22. The method according to claim 17, wherein step k) comprises adjusting said auxiliary magnetic field with respect to its magnitude.

23. The method according to claim 17, wherein step k) comprises adjusting a relative position with respect to an axis substantially perpendicular to said target surface, of said primary magnet arrangement and of at least a portion of said secondary magnet arrangement.

24. The method according to claim 17, wherein step k) comprises adjusting a current flowable through a coil.

25. The magnetron sputtering source according to claim 1, wherein each of the magnets of the secondary magnet arrangement is horizontally aligned or yoke-shaped.

26. The method for manufacturing coated substrates according to claim 17, wherein each of the magnets for generating said auxiliary magnetic field is horizontally aligned or yoke-shaped.

* * * * *